(12) United States Patent
Lee et al.

(10) Patent No.: US 11,064,605 B2
(45) Date of Patent: Jul. 13, 2021

(54) POLYMER THICK FILM DIELECTRIC PASTE COMPOSITION

(71) Applicant: DUPONT ELECTRONICS, INC., Wilmington, DE (US)

(72) Inventors: Hee Hyun Lee, Wilmington, DE (US); Vincenzo Arancio, Bristol (GB)

(73) Assignee: DuPont Electronics, Inc., Wilmington, DE (US)

( * ) Notice: Subject to any disclaimer, the term of this patent is extended or adjusted under 35 U.S.C. 154(b) by 185 days.

(21) Appl. No.: 16/444,331

(22) Filed: Jun. 18, 2019

(65) Prior Publication Data
US 2019/0387621 A1   Dec. 19, 2019

Related U.S. Application Data

(60) Provisional application No. 62/686,353, filed on Jun. 18, 2018.

(51) Int. Cl.
| | | |
|---|---|---|
| *C08K 3/38* | (2006.01) | |
| *C08K 3/22* | (2006.01) | |
| *H05K 1/09* | (2006.01) | |
| *C09D 17/00* | (2006.01) | |
| *C08G 59/06* | (2006.01) | |
| *C08G 63/00* | (2006.01) | |
| *C09D 175/04* | (2006.01) | |
| *C09D 5/02* | (2006.01) | |
| *C09C 3/10* | (2006.01) | |
| *C08G 18/80* | (2006.01) | |

(52) U.S. Cl.
CPC ............. *H05K 1/095* (2013.01); *C08G 18/80* (2013.01); *C08G 59/06* (2013.01); *C08G 63/00* (2013.01); *C08K 3/38* (2013.01); *C09C 3/10* (2013.01); *C09D 5/028* (2013.01); *C09D 17/002* (2013.01); *C09D 17/008* (2013.01); *C09D 175/04* (2013.01); *C08K 2003/2241* (2013.01); *H05K 2201/0191* (2013.01); *H05K 2201/09009* (2013.01)

(58) Field of Classification Search
CPC .......................... C08K 3/38; C08K 2003/2241
See application file for complete search history.

(56) References Cited

U.S. PATENT DOCUMENTS

| 5,115,077 A | 5/1992 | Matsuo et al. |
| 2004/0161702 A1 | 8/2004 | Foster et al. |
| 2007/0083017 A1* | 4/2007 | Dueber .................. C08L 79/08 525/423 |

FOREIGN PATENT DOCUMENTS

WO    2017/138388 A1    8/2017

OTHER PUBLICATIONS

PCT International Search Report for Application No. PCT/US2019/037659; Blaine R. Copenheaver, Authorized Officer; ISA/US; dated Aug. 7, 2019.

* cited by examiner

*Primary Examiner* — Wenwen Cai
(74) *Attorney, Agent, or Firm* — John J. Piskorski

(57) ABSTRACT

This invention provides a polymer thick film dielectric paste composition, comprising a mixture of titanium dioxide and boron nitride powders, a resin blend of polyol and phenoxy resin, one or more additives selected from the group consisting of a linear aliphatic polyester, a block copolymer, a blocked aliphatic polyisocyanate, and a wetting and dispersing agent, and one or more polar, aprotic solvents. The paste composition may be used to form polymer thick film dielectric layers in electrical circuits subject to thermoforming and in articles requiring stretchable dielectric layers such as wearables.

16 Claims, No Drawings

POLYMER THICK FILM DIELECTRIC PASTE COMPOSITION

FIELD OF THE INVENTION

This invention relates to polymer thick film dielectric paste compositions for use in forming polymer thick film dielectric layers for In-Mold Electronics and wearables.

BACKGROUND OF THE INVENTION

There is increasing need for dielectrics in applications where thermoformable multi-layered circuits are required and for use in wearable garments where flexible dielectrics are needed.

In the In-Mold Electronic (IME) industry, the dielectric layer serves to protect an electrically conductive layer, e.g., a silver layer, and therefore must be screen printable with minimized pin-hole formation and be readily thermoformable and in no way negatively affect the conductive properties of the conductive layer. These dielectric layers must also provide a moisture barrier. Highly viscous polyurethane resin-based paste compositions can be problematic with pin-hole formation during the screen printing process.

Stretchable dielectrics are necessary to protect an electrically conductive layer in electrical circuits in wearable garments. Such dielectrics need to be printable with minimal pin-hole formation and to be stretchable moisture barriers and able to withstand washing and drying cycles.

There is a continuing need for improved dielectric polymer thick film paste compositions.

SUMMARY OF THE INVENTION

This invention provides a polymer thick film dielectric paste composition, comprising:
(a) a mixture of titanium dioxide and boron nitride powders;
(b) a resin blend of polyol and phenoxy resin;
(c) one or more additives selected from the group consisting of a linear aliphatic polyester, a block copolymer, a blocked aliphatic polyisocyanate, and a wetting and dispersing agent; and
(d) one or more polar, aprotic solvents, wherein the resin blend and any additives are dissolved in the one or more solvents and the titanium dioxide and boron nitride powders are dispersed in the one or more solvents.

DETAILED DESCRIPTION OF THE INVENTION

The invention relates to a polymer thick film dielectric paste composition.

In one embodiment, the paste composition is used as a protective layer for a conductor in an electrical circuit that is to be thermoformed. The paste composition has good flow through screen mesh openings during the printing process that minimizes or eliminates pin-hole formation and achieves good dielectric insulation. The dried dielectric layer also adheres to the conductor or the plastic substrate.

In another embodiment, the paste composition is used to form protectable stretchable dielectric layers for electrical circuits in articles such as wearable garments and seats.

The invention also provides articles containing such dielectrics.

Describing the instant paste composition as "dielectric" is done so meaning that the composition can be formed into a structure and thereafter processed to exhibit dielectric properties.

When the paste composition is used to form stretchable dielectric films for articles such as wearable garments and seats the dielectric film formed from the paste composition must adhere well to the substrate on which it has been deposited. When the article is a wearable garment the film must maintain its conductive properties despite being subjected to wash and dry cycles.

The instant polymer thick film dielectric paste composition comprises a mixture of titanium dioxide ($TiO_2$) and boron nitride (BN) powders, a resin blend of polyol and phenoxy resin, at least one additive selected from the group consisting of a linear aliphatic polyester, a block copolymer, a blocked aliphatic polyisocyanate, and a wetting and dispersing agent and one or more polar, aprotic solvents, wherein the resin blend and the one or more additives are dissolved in the one or more solvents and the inorganic powder is dispersed in the one or more solvents.

The paste composition is named a polymer thick film paste composition because the polymer remains as a component in the dielectric film. The various components will be discussed in detail in the following sections.

Titanium Dioxide and Boron Nitride Powders

The paste composition comprises a blend of $TiO_2$ and BN powders.

The $TiO_2$ and BN powders used in the present paste composition may be supplied as finely divided particles having any morphology, including without limitation, any one or more of the following morphologies: a flake form, a spherical form, a rod form, a granular form, a nodular form, a platelet form, a layered or coated form, or other irregular forms. Also contemplated are mixtures of particles of more than one of these types or mixtures of particles of the same type that have different size distributions.

The particle size of the powder is not subject to any particular limitation, provided the required functional properties are attainable. As used herein, "particle size" is intended to refer to "median particle size" or $d_{50}$, by which is meant the 50% volume distribution size. The particle size distribution may also be characterized by other parameters, such as $d_{90}$, meaning that 90% by volume of the particles are smaller than $d_{90}$, or $d_{10}$, meaning that 10% of the particles are smaller than $d_{10}$. Volume distribution size may be determined by a number of methods understood by one of skill in the art, including but not limited to laser diffraction and dispersion methods employed by a Microtrac X100 particle size analyzer (Montgomeryville, Pa.). Laser light scattering, e.g., using a model LA-910 particle size analyzer available commercially from Horiba Instruments Inc. (Irvine, Calif.), may also be used. In various embodiments, the median size of the inorganic particles is greater than 0.1 μm and less than 10 μm, as measured using the Microtrak X100 analyzer.

In one embodiment, the $TiO_2$ and BN powders comprises from about 40 wt % to about 65 wt % of the paste composition, based on the total weight of the paste composition. The ratio of the weight of the $TiO_2$ powder to the weight of the BN powder, $TiO_2$/BN, is in the range from about 2 to about 25.

Resin Blend of Polyol and Phenoxy Resin

The resin blend is one of polyol and phenoxy resin.

Polyol contains multiple hydroxy groups and reacts with isocyanates to form polyurethanes.

The phenoxy resin with the following basic repeating form:

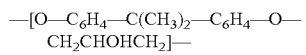

and structure

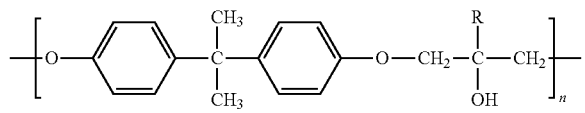

also contains hydroxy groups.

In one embodiment, the resin blend comprises from about 5 wt % to about 20 wt % of the paste composition, based on the total weight of the paste composition.

In one embodiment, the polyol comprises from about 1 wt % to about 5 wt % of the paste composition, based on the total weight of the paste composition and phenoxy resin comprises from about 4 wt % to about 15 wt % of the paste composition, based on the total weight of the paste composition.

Additives

The paste composition comprises one or more additives selected from the group consisting of a linear aliphatic polyester, a block copolymer, a blocked aliphatic polyisocyanate, and a wetting and dispersing agent.

A blocked aliphatic polyisocyanate is an isocyanate reaction product that is stable at room temperature but dissociates to regenerate isocyanate functionality when heated. The isocyanate functional group in a blocked polyisocyanate is masked through the use of a blocking agent producing a compound that is seemingly inert at room temperature yet yields the reactive isocyanate functionality at elevated temperatures. For the blocked aliphatic isocyanates used herein curing temperatures of 110-160° C. release the blocking agents. The resulting polyisocyanates can then react with active hydroxy-containing compounds in the resin blend.

Typical aliphatic polyisocyanates are hexamethylene diisocyanate (HDI) and isophorone diisocyanate (IPDI).

Typical blocking agents are 3,5-dimethylpyrazole (DMP), diethyl malonate (DEM), diisopropylamine (DIPA), 1,2,4-triazole (TRIA) and methyl ethyl ketone (MEKO).

Typical blocked aliphatic polyisocyanates are DMP blocked HDI, (DEM)/(DIPA) blocked HDI and DEM blocked polyisocyanate using both HDI and IPDI. MEKO blocked polyisocyanate using $H_{12}MDI$ can also be used.

In one embodiment, the blocked aliphatic polyisocyanate comprises from about 0.5 wt % to about 5 wt % of the paste composition, based on the total weight of the paste composition.

In an embodiment, the linear aliphatic polyester comprises about 1 wt % to about 5 wt % of the paste composition, based on the total weight of the paste composition. In one embodiment, the linear aliphatic polyester is a linear aliphatic polycarbonate polyester.

In an embodiment, the block copolymer comprises about 1 wt % to about 5 wt % of the paste composition, based on the total weight of the paste composition. In one embodiment, the block copolymer is a nonionic difunctional block copolymer surfactant with terminal secondary hydroxy groups.

The wetting and dispersing agent is used to stabilize the $TiO_2$ and BN particles. In an embodiment, the wetting and dispersing agent comprises about 0.1 wt % to about 0.5 wt % of the paste composition, based on the total weight of the paste composition.

Solvents

One or more polar, aprotic solvents are present in the paste composition. The resin blend and the one or more additives are dissolved in the one or more solvents and the $TiO_2$ and BN powders are dispersed in the one or more solvents. A small amount of additional solvent may be added to the paste composition to adjust the final viscosity for dispensing or printing.

Typical solvents used are dipropylene glycol methyl ether, 2-butoxyethanol and triethyl phosphate.

In one embodiment, the solvents comprise from about 15 wt % to about 40 wt % of the paste composition, based on the total weight of the paste composition.

Preparation of Polymer Thick Film Dielectric Paste Composition

The resin blend is dispersed in a solvent or mixed solvent to dissolve the resin blend. It can be heated, e.g., to 70° C., and stirred to dissolve the resin and form an organic medium. Portions of the resin blend can be dissolved in different solvents or in the same solvent to form additional organic media. Alternatively, a single organic medium can be used. The one or more additives are added to one of the organic mediums and mixed. The $TiO_2$ and BN powders are added to one of the organic mediums and mixed. The $TiO_2$ and BN powders are typically added incrementally with mixing after each addition to ensure better wetting. Typically the BN powder was added first followed by the $TiO_2$ powder. If more than one organic medium has been prepared, the media can be combined after any of the above steps and the resulting paste composition is milled. Solvent may be added to adjust the viscosity before dispensing or printing the paste composition.

EXAMPLES, COMPARATIVE EXPERIMENTS

Examples 1-4, Comparative Experiments A-B

The dielectric paste compositions of Examples 1-4 were prepared in the following manner.

The polymer media used were:

Polymer medium 1 (PM-1)—Prepared by mixing 30 wt % blend of phenoxy resin and polyester polyol (PKHM-301, Gabriel, Akron, Ohio) with 70 wt % dipropylene glycol methyl ether (Dowanol™ DPM, Dow Chemical Co., Midland, Mich.). The manufacturer of PKHM-301 says it has a hydroxy content of 334 (OH equivalent weight, g/equiv.) and a molecular weight of 39,000 daltons. This mixture was heated and stirred at 70-90° C. for 3 hours or until all the resin was dissolved and then cooled to room temperature.

Polymer medium 2 (PM-2)—Prepared by mixing 20 wt % phenoxy resin (PKHH Gabriel, Akron, Ohio) with 80 wt % dipropylene glycol methyl ether (Dowanol™ DPM, Dow Chemical Co., Midland, Mich.). The manufacturer of PKHH says it has a hydroxy content of 280 (OH equivalent weight, g/equiv.) and a molecular weight of 52,000 daltons. This mixture was heated and stirred at 70-90° C. for 3 hours or until all the resin was dissolved and then cooled to room temperature.

co

Polymer medium 4 (PM-4)—Prepared by mixing 5 wt % phenoxy resin (PKHH Gabriel, Akron, Ohio) and 20 wt % linear hydroxyl polyurethane (Desmocoll® 406, Covestro, Pittsburgh, Pa.) with 75 wt % dipropylene glycol methyl ether (Dowanol™ DPM, Dow Chemical Co., Midland, Mich.). The manufacturer of Desmocoll® 406 says that this polymer is predominantly linear hydroxyl polyurethane. It is a flexible polyurethane with a low crystallization rate. This mixture was heated and stirred at 70-90° C. for 3 hours or until all the resin was dissolved and then cooled to room temperature.

Polymer medium 5 (PM-5)—Prepared by mixing 20.5 wt % linear hydroxyl polyurethane (Desmocoll® 530, Covestro, Pittsburgh, Pa.) with 79.5 wt % dibasic esters (Flexisolv® DBE®-9 Esters, Invista, Wichita, Kans.). The manufacturer of Desmocoll® 530 says that this polymer is predominantly linear hydroxyl polyurethane. It is a flexible polyurethane with a high crystallization rate and very low thermoplasticity. This mixture was heated and stirred at 70-90° C. for 3 hours or until all the resin was dissolved and then cooled to room temperature.

Polymer medium 6 (PM-6)—Prepared by mixing 27 wt % phenoxy resin (PKHH Gabriel, Akron, Ohio) and 73% dibasic esters (Flexisolv® DBE®-9 Esters, Invista, Wichita, Kans.). This mixture was heated and stirred at 70-90° C. for 3 hours or until all the resin was dissolved and then cooled to room temperature.

The additives used were:

A-1—linear aliphatic polycarbonate polyester (Desmophen® C 1200, Covestro, Pittsburgh, Pa.)

A-2—nonionic difunctional block copolymer surfactant with terminal secondary hydroxyl groups (Pluronic® 31R1, BASF)

A-3—blocked aliphatic H12MDI-polyisocyanate (Desmodur BL 5375, Covestro, Pittsburgh, Pa.)

A-4—wetting and dispersing agent (DISPERBYK-111, Palmerholland, North Olmsted, Ohio)

The inorganic powders used were:

$TiO_2$—rutile titanium dioxide, approximately spherical, mean particle size ~0.29 μm (Ti-Pure™ R-101, Chemours, Wilmington, Del.)

BN—boron nitride platey hexagonal crystal structure powder (CarboTherm™ CTF10 Boron Nitride Powder, Saint-Gobain)

Solvents used were:

S-1—dipropylene glycol methyl ether (Dowanol™ DPM, Dow Chemical Co., Midland, Mich.)

S-2—triethyl phosphate (TEP) (Eastman Chemical Co., Kingsport, Tenn.)

S-3—dibasic esters (DBE-9, Invista, Wichita, Kans.)

The requisite amounts of polymer medium, additives, and solvent for each sample in Table 1 was weighed and then mixed to form an organic vehicle. $TiO_2$ and BN powders were added to the organic vehicle and further mixed to form a paste composition. These inorganic powders were added incrementally, with mixing after each addition to ensure better wetting. Typically, BN was added first followed by $TiO_2$.

Each of the foregoing mixing steps might be carried out in a planetary, centrifugal mixer. A Thinky® mixer (available from Thinky® USA, Inc., Laguna Hills, Calif.) operated at 1000 rpm for 30 s was suitable. After being well mixed, the paste composition was repeatedly passed through a three-roll mill with a 25 μm gap at pressures that are progressively increased from 0 to 150 psi (~1.04 MPa). A suitable mill is available from Charles Ross and Son, Hauppauge, N.Y.

The degree of dispersion of each paste composition may be measured using commercial fineness of grind (FOG) gages (e.g., gages available from Precision Gage and Tool, Dayton, Ohio) in accordance with ASTM Standard Test Method D 1210-05, which is promulgated by ASTM International, West Conshohocken, Pa., and is incorporated herein by reference. The resulting data are ordinarily expressed as FOG values represented as X/Y, meaning that the size of the largest particle detected is X μm and the median size is Y μm. In an embodiment, the FOG values of the present paste compositions are typically 20/10 or less, which typically has been found to be sufficient for good printability.

Ordinarily, the processed paste composition is adjusted prior to printing by adding a small amount of solvent as required to obtain a viscosity suitable for dispensing, stencil or screen printing. Viscosity values may be obtained using a Brookfield viscometer (Brookfield Inc., Middleboro, Mass.) with a #14 spindle and a #6 cup. Typically, a final viscosity of about 60-90 Pa·s (measured at 10 rpm/3 min) is found to yield good dispensing printing results and a final viscosity of 25-70 Pa·s (measured at 10 rpm/3 min) is found to yield good screen printing results, but some variation, for example ±30 Pas or more would be acceptable, depending on the precise printing apparatus and parameters.

The amounts in grams (g) of each of the components used in the Examples and Comparative Experiments are shown in Table I.

TABLE I

| Sample | Organic vehicle | Filler |
|---|---|---|
| Example 1 | 60 g of PM-1, 51 g of PM-2, 8.25 g of A-2, 0.75 g of A-4, 25.2 g of S-1 | 135 g of $TiO_2$, 45 g of BN |
| Example 2 | 45 g of PM-1, 66 g of PM-2, 8.25 g of A-2, 0.75 g of A-4, 24 g of S-1 | 135 g of $TiO_2$, 45 g of BN |
| Example 3 | 86.9 g of PM-3, 7.5 g of A-1, 0.63 g of A-4, 31.5 g of S-1, 3.75 g of S-2 | 125 g of $TiO_2$, 6.25 g of BN |
| Example 4 | 86.9 g of PM-3, 7.5 g of A-1, 2.5 g of A-3, 0.63 g of A-4, 28.5 g of S-1, 3.75 g of S-2 | 125 g of $TiO_2$, 6.25 g of BN |
| Comp. Exp. A | 79.5 g of PM-4, 67.5 g of PM-2, 8.25 g of A-2, 0.75 g of A-4, 22 g of S-1 | 108 g of $TiO_2$, 36 g of BN |
| Comp. Exp. B | 70.2 g of PM-5, 98.1 g of Medium F, 19.5 gram of DBE-9 | 112.2 g of $TiO_2$ |

Printing Characterization

The printing performance of the dielectric paste compositions of Examples 1-2 and Comparative Experiments A-B in Table I were evaluated by the following procedure.

1. 20 mil thick polycarbonate from Tekra was cut to 3×4 inches size and run through a Natgraph belt drier.
2. A first silver conductor (DuPont™ ME603, Silver Conductor, DuPont Co., Wilmington, Del.) was printed using 80 durometer diamond squeegee and 325/1.1 s/s (stainless steel) mesh screen followed by drying in the Natgraph belt drier.
3. Two dielectric layers were printed on top of the first conductor using, in turn, the dielectric paste compositions of Examples 1-2 and Comparative Experiments A-B using 60 durometer diamond squeegee and 280 s/s mesh screen to form a composite dielectric over the first conductor. Each dielectric layer was dried after printing in the Natgraph belt drier.
4. A second silver conductor (DuPont™ ME603, Silver Conductor, DuPont Co., Wilmington, Del.) was printed on the composite dielectric layer using 80 durometer diamond squeegee and 325/1.1 s/s (stainless steel) mesh screen followed by drying in the Natgraph belt drier
5. The thickness of the composite dielectric layer was measured using a hand micrometer.

6. The Breakdown Voltage (BDV) was measured using a HiPot testor. There were 8 such measurements for each sample.

The average breakdown voltage data (kV/mil) as thus measured are set forth in Table II along with observations regarding the number of pinholes.

TABLE II

| Sample | BDV (kV/mil) | Printing quality |
|---|---|---|
| Example 1 | 1.45 | Few pinholes |
| Example 2 | 1.19 | Few pinholes |
| Comp. Exp. A | 0.44 | Many pinholes |
| Comp. Exp. B | 0.07 | Large pinholes and rough surface |

Thermoforming

The thermoforming performance of the dielectric paste compositions of Examples 3-4 and Comparative Experiment B in Table I were evaluated by the following procedure.

1. 15 mil thick Polycarbonate (Makrofol Clear G/M, Covestro DE1-4) was cut to 12×12 inches size and run through Natgraph belt drier.
2. A first silver conductor (DuPont™ ME603, Silver Conductor, DuPont Co., Wilmington, Del.) was printed using 80 durometer diamond squeegee and 325/1.1 s/s (stainless steel) mesh screen followed by drying in the Natgraph belt drier.
3. Two dielectric layers were printed on top of the first conductor using, in turn, the dielectric paste compositions of Examples 3-4 and Comparative Experiment B using 60 durometer diamond squeegee and 280 s/s mesh screen to form a composite dielectric over the first conductor. Each dielectric layer was dried after printing in the Natgraph belt drier.
4. A second silver conductor (DuPont™ ME603, Silver Conductor, DuPont Co., Wilmington, Del.) was printed on the composite dielectric layer using 80 durometer diamond squeegee and 325/1.1 s/s (stainless steel) mesh screen followed by drying in the Natgraph belt drier.
5. The printed samples were then thermoformed using a Formec Thermoforming Machine.
6. The Breakdown Voltage (BDV) was measured using a HiPot testor. There were 49 such measurements for each sample.

The average breakdown voltage data (kV/mil) as thus measured are set forth in Table III.

TABLE III

| Sample | BDV (kV/mil) |
|---|---|
| Example 3 | 0.78 |
| Example 4 | 1.12 |
| Comp. Exp. B | 0 |

The BDV data in Table II reveal that dielectric layers printed with the paste compositions of Examples 1-2 containing the resin blend of polyol and phenoxy resin and a mixture of additives of flexible block copolymer and wetting and dispersing agent show desirably higher BDV than dielectric layers printed with Comparative Experiment A-B pastes which contain polyurethane and phenoxy resins but no polyol. The BDV in Table III show that Example 3 containing the resin blend of polyol and phenoxy resin and a mixture of additives of flexible polyester and wetting and dispersing agent and Example 4 containing the resin blend of polyol and phenoxy resin and a mixture of additives of flexible polyester, blocked aliphatic polyisocyanate and wetting and dispersing agent exhibit good flexibility and thus show a high BDV even after thermoforming in contrast to that found for Comparative Experiment B.

What is claimed is:

1. A paste composition, comprising:
   (a) a mixture of titanium dioxide and boron nitride powders;
   (b) a resin blend of polyol and phenoxy resin;
   (c) one or more additives selected from the group consisting of a linear aliphatic polyester, a block copolymer, a blocked aliphatic polyisocyanate, and a wetting and dispersing agent; and
   (d) one or more polar, aprotic solvents, wherein the resin blend and the one or more additives are dissolved in the one or more solvents and the titanium dioxide and boron nitride powders are dispersed in the one or more solvents, wherein the paste composition comprises 40-65 wt % of the mixture of titanium dioxide, $TiO_2$, and boron nitride, BN, powders, 5-20 wt % of the resin blend and 15-40 wt % of the one or more solvents, wherein the wt % are based on the total weight of the paste composition.

2. The paste composition of claim 1, said resin blend comprising 1-5 wt % of the polyol and 4-15 wt % of the phenoxy resin, wherein the wt % are based on the total weight of the paste composition.

3. The paste composition of claim 1, wherein the ratio of the weight of the $TiO_2$ powder to the weight of the BN powder, $TiO_2$/BN, is in the range from about 2 to about 25.

4. The paste composition of claim 1, wherein the one or more additives are the block polymer and the wetting and dispersing agent.

5. The paste composition of claim 1, wherein the one or more additives are the linear aliphatic polyester and the wetting and dispersing agent.

6. The paste composition of claim 1, wherein the one or more additives are the linear aliphatic polyester, the blocked aliphatic polyisocyanate, and the wetting and dispersing agent.

7. The paste composition of claim 1, wherein the one or more additives are present in amounts of 1-5 wt % of the linear aliphatic polyester, 1-5 wt % of the block copolymer, 0.5-5 wt % of the blocked aliphatic polyisocyanate, and 0.1-0.5 wt % of the wetting and dispersing agent, wherein the wt % are based on the total weight of the paste composition.

8. An article comprising:
   an electrical circuit containing a polymer thick film dielectric layer formed from a paste composition, comprising:
   (a) a mixture of titanium dioxide and boron nitride powders;
   (b) a resin blend of polyol and phenoxy resin;
   (c) one or more additives selected from the group consisting of a linearaliphatic polyester, a block copolymer, a blocked aliphatic-polyisocyanate, and a wetting and dispersing agent; and
   (d) one or more polar, aprotic solvents, wherein the resin blend and the one or more additives are dissolved in the one or more solvents and the titanium dioxide and boron nitride powders are dispersed in the one or more solvents, wherein the paste composition comprises 40-65 wt % of the mixture of titanium dioxide, TiO$_2$, and boron nitride, BN, powders, 5-20 wt % of the resin blend and 15-40 wt % of the one or more solvents, wherein the wt % are based on the total weight of the paste composition.

9. The article of claim 8, said resin blend comprising 1-5 wt % of the polyol and 4-15 wt % of the phenoxy resin, wherein the wt % are based on the total weight of the paste composition.

10. The article of claim 8, wherein the ratio of the weight of the TiO$_2$ powder to the weight of the BN powder, TiO$_2$/BN, is in the range from about 2 to about 25.

11. The article of claim 8, wherein the one or more additives are the block polymer and the wetting and dispersing agent.

12. The article of claim 8, wherein the one or more additives are the linear aliphatic polyester and the wetting and dispersing agent.

13. The article of claim 8, wherein the one or more additives are the linear aliphatic polyester, the blocked aliphatic polyisocyanate, and the wetting and dispersing agent.

14. The article of claim 8, wherein the one or more additives are present in amounts of 1-5 wt % of the linear aliphatic polyester, 1-5 wt % of the block copolymer, 0.5-5 wt % of the blocked aliphatic polyisocyanate, and 0.1-0.5 wt % of the wetting and dispersing agent, wherein the wt % are based on the total weight of the paste composition.

15. The article of claim 8, wherein said article has been thermoformed.

16. The article of claim 8, wherein said article is a wearable garment.

* * * * *